United States Patent [19]

Sakamoto et al.

[11] Patent Number: 5,286,983
[45] Date of Patent: Feb. 15, 1994

[54] THIN-FILM-TRANSISTOR ARRAY WITH CAPACITANCE CONDUCTORS

[75] Inventors: Takao Sakamoto; Kazuhiro Kobayashi; Masahiro Hayama; Naoki Nakagawa, all of Amagasaki, Japan

[73] Assignee: Mitsubishi Denki Kabushiki Kaisha, Tokyo, Japan

[21] Appl. No.: 962,342

[22] Filed: Oct. 16, 1992

[30] Foreign Application Priority Data

Oct. 18, 1991 [JP] Japan ................... 3-270863

[51] Int. Cl.⁵ ........................................... H01L 27/14
[52] U.S. Cl. ........................... 257/59; 257/291; 257/448; 359/54; 359/88; 359/87
[58] Field of Search ............ 257/88, 91, 99, 59, 257/443, 448, 291; 359/54, 87, 88

[56] References Cited

U.S. PATENT DOCUMENTS

| 4,717,244 | 1/1988 | Hilsum et al. | 359/88 X |
| 4,759,610 | 7/1988 | Yanagisawa | 257/59 X |
| 5,028,122 | 7/1991 | Hamada et al. | 359/54 X |
| 5,042,916 | 8/1991 | Ukai et al. | 257/59 X |
| 5,066,106 | 11/1991 | Sakamoto et al. | 359/59 |
| 5,162,901 | 11/1992 | Shimada et al. | 359/54 X |
| 5,187,601 | 2/1993 | Yamazaki et al. | 359/54 |
| 5,193,017 | 3/1993 | Iwai et al. | 257/59 X |
| 5,194,974 | 3/1993 | Hamada et al. | 359/54 X |

FOREIGN PATENT DOCUMENTS 1-197722 8/1989 Japan .
3-141325 6/1991 Japan .

OTHER PUBLICATIONS

Brody et al., "A 6×6 Inch 20 Lines-Per-Inch Liquid Crystal Display", IEEE Transactions on Electron Devices, vol. ED-20, No. 11, Nov. 1973, pp. 995–1001.
No Author, "Capacitively-Coupled TFT/LCD with Minimized Parasitic Effects", *IBM Technical Disclosure Bulletin*, vol. 31, No. 3, Aug. 1988, pp. 94–97.

*Primary Examiner*—William Mintel
*Attorney, Agent, or Firm*—Leydig, Voit & Mayer

[57] ABSTRACT

A TFT array for a display device includes a plurality of spaced apart gate conductors and a plurality of spaced apart source conductors crossing over the gate conductors. TFT's are arranged in rows and columns. The gates of TFT's in each row are connected to a gate conductor for that row, and the sources of TFT's in each column are connected to a source conductor for that column. The drains of the TFT's are connected to respective pixel electrodes arranged in rows and columns. Each of a plurality of display sections has a storage capacitance connected at one end to an associated pixel electrode. Storage capacitance conductors are arranged parallel to respective gate conductors. Storage capacitors associated with the display sections in each row are connected to a storage capacitance conductor that is connected to the gate conductor of the next adjacent row.

14 Claims, 7 Drawing Sheets

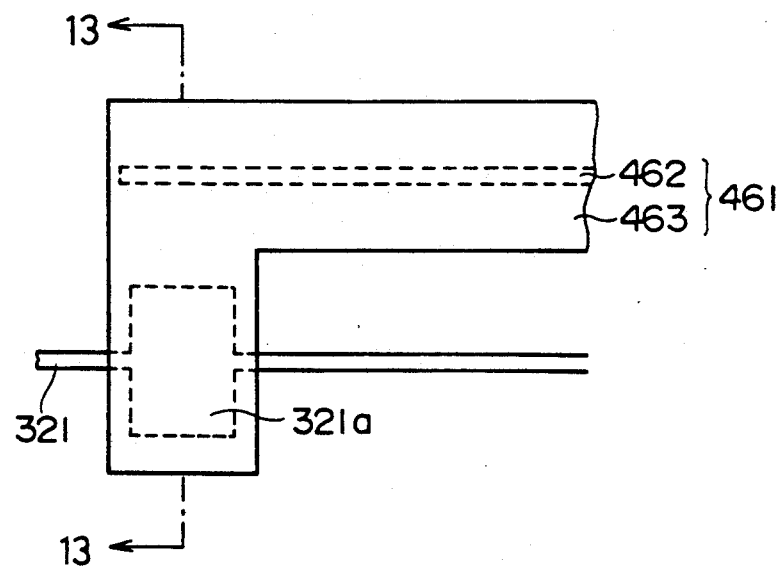
F I G. 12
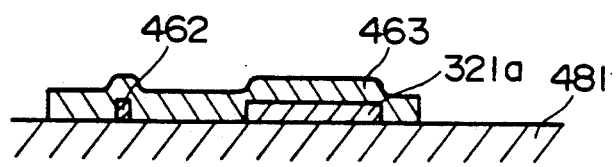
F I G. 13
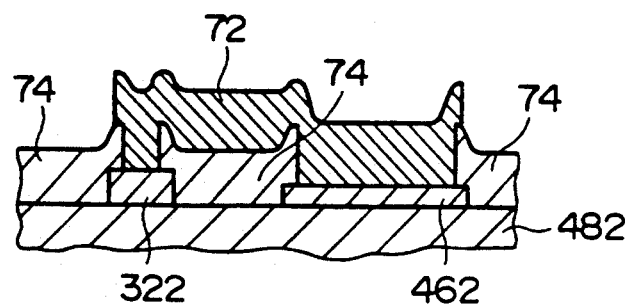
F I G. 14

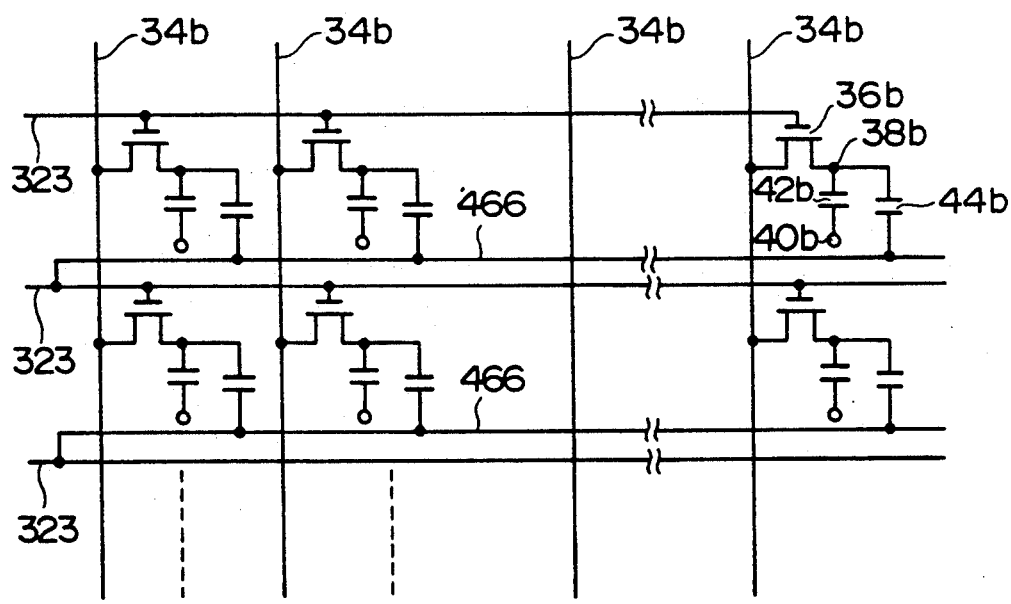
F I G. 16

THIN-FILM-TRANSISTOR ARRAY WITH CAPACITANCE CONDUCTORS

The present invention relates to a thin-film-transistor array for applying drive voltages to pixel electrodes of a liquid crystal display device and, more particularly, to such a thin-film-transistor array for a liquid crystal display device having storage capacitance.

BACKGROUND OF THE INVENTION

Some liquid crystal display devices are of an active matrix drive type. As shown in FIG. 1, in this type of liquid crystal display device, transparent plates 10 and 12 face each other with a liquid crystal layer 14 disposed between them. Transparent pixel electrodes (not shown) are arranged in matrix on a surface of the plate 10 which contacts the liquid crystal layer 14, and a transparent common electrode 16 is disposed over the entire surface of the plate 12 contacting the liquid crystal layer 14. The liquid crystal absorbs light when a voltage above a predetermined value is applied across it. Accordingly, a desired pattern can be displayed by applying a fixed voltage, e.g., ground potential, to the common electrode 16 and applying drive voltages to selected pixel electrodes. The liquid crystal layer 14 absorbs light at the portions located between the selected pixel electrodes 14 and the common electrode 16.

In order to select pixel electrodes to which a drive voltage is to be applied, a thin film transistor (TFT) is associated with each pixel electrode, and a plurality of gate conductors 18 and a plurality of source conductors 20 crossing over the respective gate conductors 18 are disposed on the surface of the plate 10 which contacts the liquid crystal layer 14. The TFT's are disposed at the respective intersections of the conductors 18 and 20 in matrix, to form a thin film transistor (TFT) array.

FIG. 2 is an equivalent circuit diagram of the TFT array shown in FIG. 1. TFT's 22 in one row have their respective gates connected to an associated gate conductor 18, and TFT's 22 in one column have their respective sources connected to an associated source conductor 20. The drain of each of the TFT's 22 is connected to the pixel electrode 24 with which that TFT 22 is associated. The capacitance of the liquid crystal layer 14 between each of the pixel electrodes 24 and the common electrode 16 is denoted by a reference numeral 26. In order to apply a drive voltage to a particular pixel electrode 24, a voltage for turning on the TFT 22 to which that pixel electrode is connected is applied to one end of the gate conductor 18 to which the gate of that TFT 22 is connected, and the drive voltage is applied to the source conductor 20 to which the source of that TFT is connected.

In the TFT array, when the TFT 22 is turned off after it has been turned on, the drive voltage is held by the liquid crystal capacitance 26. The thus held drive voltage may decrease due to discharge through the liquid crystal layer 14 or due to leakage current in the TFT 22.

An attempt to solve this problem is disclosed in IEEE TRANSACTIONS ON ELECTRON DEVICES, Vol. ED-20, No. 11, November 1973, pages 995-1001, in which a storage capacitance 28 is disposed between a pixel electrode 24 and a gate conductor 18 for the adjacent row, as shown in FIG. 3. One of the techniques for connecting the storage capacitance 28 to the adjacent row gate conductor 18 is shown in Japanese Unexamined Patent Publication No. HEI 1-197722 which was laid open to public on Aug. 9, 1989. In this Japanese publication, as shown in FIG. 4, the edge of each pixel electrode 24 adjacent to a gate conductor 18 for the next adjacent row extends to a location above that gate conductor 18 to thereby form an overlap 24a. As shown in FIG. 5, between the gate conductor 18 and the overlap 24a, there is disposed a silicon nitride layer 30 which is a dielectric for the storage capacitance 28. Although not shown in FIG. 4, the silicon nitride layer 30 is an extension of a gate insulating film which is disposed on an extension 18a of the gate conductor 18 for forming a TFT. In FIG. 4, a reference numeral 32 denotes a drain electrode.

As shown in FIGS. 3 and 4, a connection of a storage capacitor to a gate conductor 18 of an adjacent row is provided for each pixel electrode 24 by an extension 24a. Accordingly, a need for providing the metal conductor for connecting the pixel electrode 24 to the gate conductor of the adjacent row is eliminated. If such a metal conductor were used, it would overlap the pixel electrode 24 and block light at the overlap, which would reduce the aperture ratio (a ratio of an area through which light can pass) to the total area. However, the use of the extension 24a does not cause an aperture ratio reduction.

However, in order to use pixel electrode extensions 24a, it is necessary to provide the gate conductor at its edge with a slope as shown in FIG. 5 to avoid disconnection of the extension 24a at the edge of the gate conductor 18. Alternatively, the thickness of the extension 24a could be larger than that of the gate conductor 18. This impedes improvement in degree of freedom in designing TFT's.

Furthermore, with the above-described structure, if one gate conductor 18 is disconnected at some point, TFT's 22 connected to that gate conductor 18 at points beyond the disconnection point will receive no voltage for turning on them. Therefore the circuit redundancy against gate conductor disconnection of this structure is low.

Furthermore, in this structure, a voltage for turning on the TFT's 20 is applied to each gate conductor 18 at one end thereof. If the gate conductors 18 are formed of a relatively high resistance material, such as phosphorus doped polycrystalline silicon, or if the gate conductors 18 have a small cross-sectional area, the capacitance associated with the gate conductor 18 and the resistance of the gate conductor 18 will cause delay in the TFT turn-on voltage while it is transmitted through the gate conductor 18.

Therefore, an object of the present invention is to improve the degree of freedom in designing TFT's to thereby simplify the TFT array manufacturing process.

Another object of the present invention is to provide a TFT array with an improved redundancy against gate conductor disconnection.

A still further object of the present invention is to provide a TFT array with reduced TFT turn-on voltage delay.

SUMMARY OF THE INVENTION

A TFT array according to the present invention includes a plurality of spaced gate conductors and a plurality of spaced source conductors which cross over the gate conductors. A plurality of TFT's are arranged in rows and columns to form a matrix. Gates of TFT's in each row are connected to an associated gate conductor, and sources of TFT's in each column are connected to an associated source conductor. Pixel electrodes of a display device arranged in rows and columns are connected to drains of respective TFT's. Each of display sections of the display device arranged in rows and columns has a storage capacitance having one end connected to an associated pixel electrode. The other ends of the respective storage capacitances of the display sections in each row are connected to an associated storage capacitance conducter disposed parallel to the gate conductors. Each of the storage capacitance conductors is connected at least one end to the gate conductor for an adjacent row of TFT's.

Each of the storage capacitance conductors may be connected at its ends to an adjacent row gate conductor.

Further, the resistance per unit length of the storage capacitance conductors may be made lower than that of gate conductors.

The storage capacitance conductors may be of a conductive material which is highly transparent to visible light.

The storage capacitance conductors may be of a combination of a conductive material which is highly transparent to visible light and a conductive material which is low in transmissivity to visible light.

A thick electrode may be used to connect each of the storage capacitance conductors to an adjacent row gate electrode. When an oxide compound conductive material is used as a material for the storage capacitance conductors, a material exhibiting a small contact resistance with respect to the storage capacitance conductors may be used for the electrodes.

BRIEF DESCRIPTION OF THE DRAWINGS

FIG. 9b is a cross-sectional view along the line b—b in FIG. 9a;

FIG. 12 is a plan view showing a portion of the TFT array shown in FIG. 10 where an end of a storage capacitance conductor is connected to a gate conductor;

FIG. 13 is a cross-sectional view takes along the line 13—13 in FIG. 12;

FIG. 14 is a cross-sectional view of a TFT array constructed in accordance with a third embodiment of the present invention;

FIG. 16 shows an equivalent circuit of a TFT circuit constructed in accordance with a fourth embodiment of the present invention.

DESCRIPTION OF EMBODIMENTS

Figure 1:
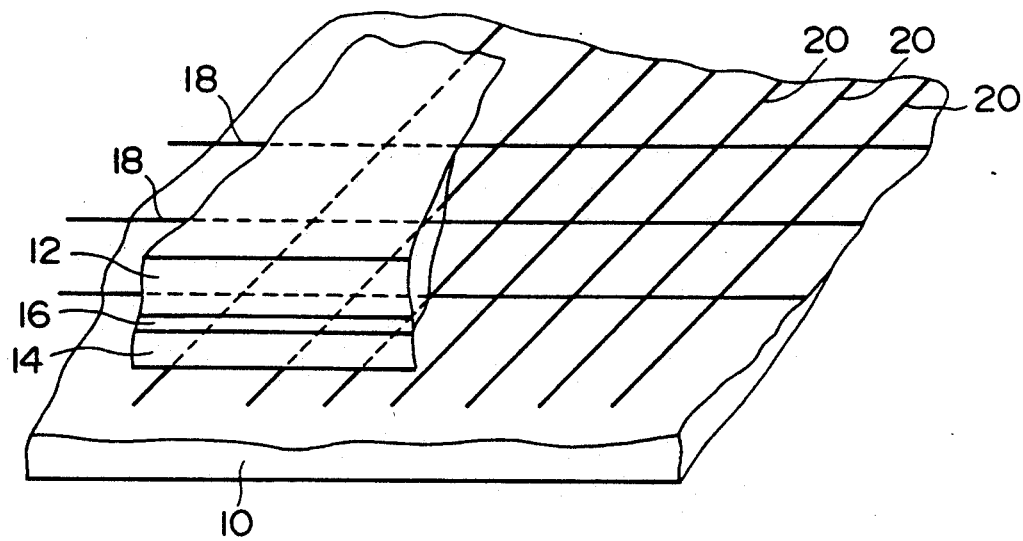
FIG. 1 is a perspective view of a portion of a liquid crystal display device with a conventional thin-film-transistor (TFT) array.
Figure 2:
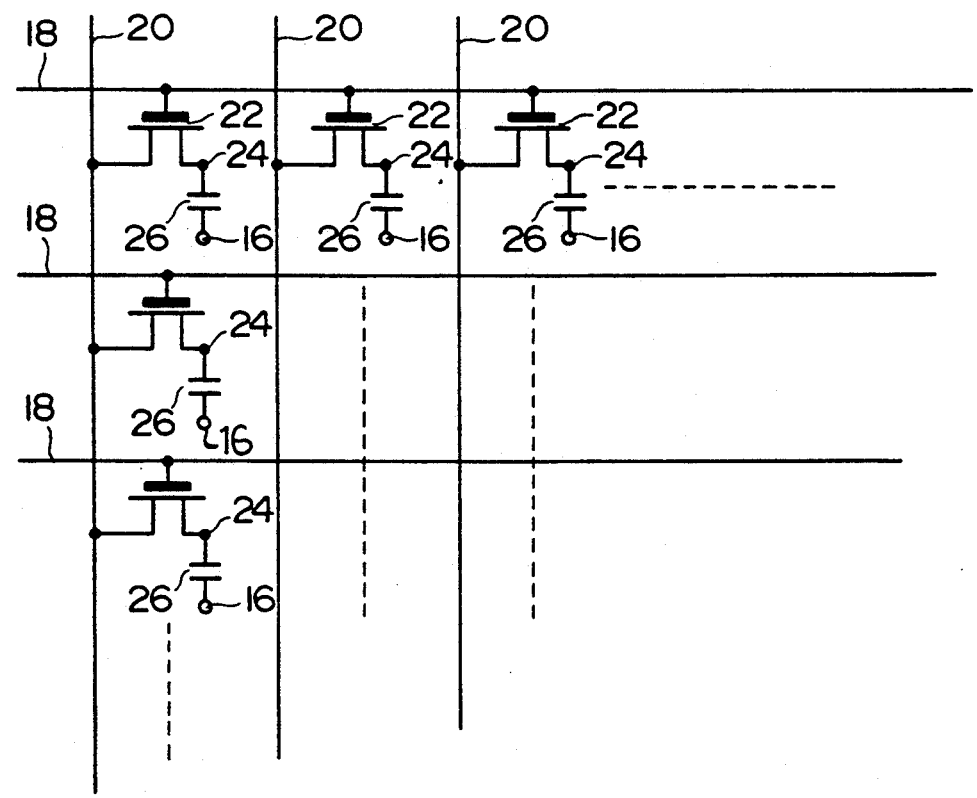
FIG. 2 is an equivalent circuit diagram for explaining the liquid crystal display device of FIG. 1.
Figure 3:
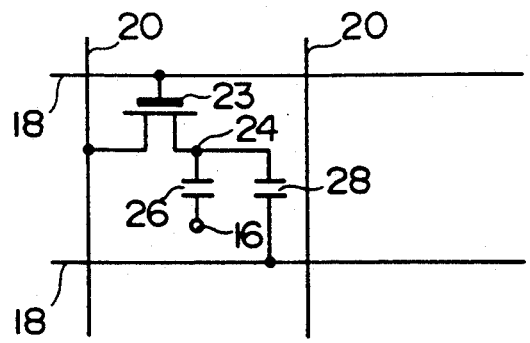
FIG. 3 is an equivalent circuit diagram for use in explaining a liquid crystal display device with another conventional TFT array.
Figure 4:
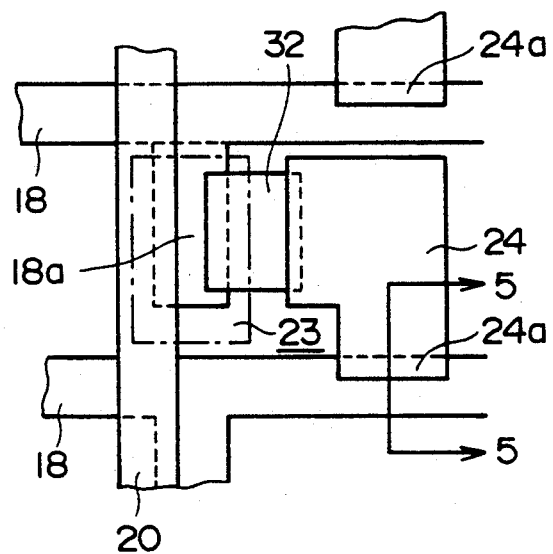
FIG. 4 is a plan view of a portion of the liquid crystal display device shown in FIG. 3.
Figure 5:
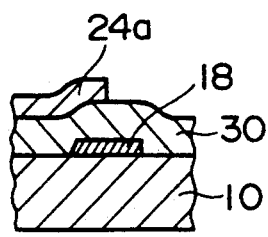
FIG. 5 is a cross-sectional view taken along the line 5—5 in FIG. 4.
Figure 6:
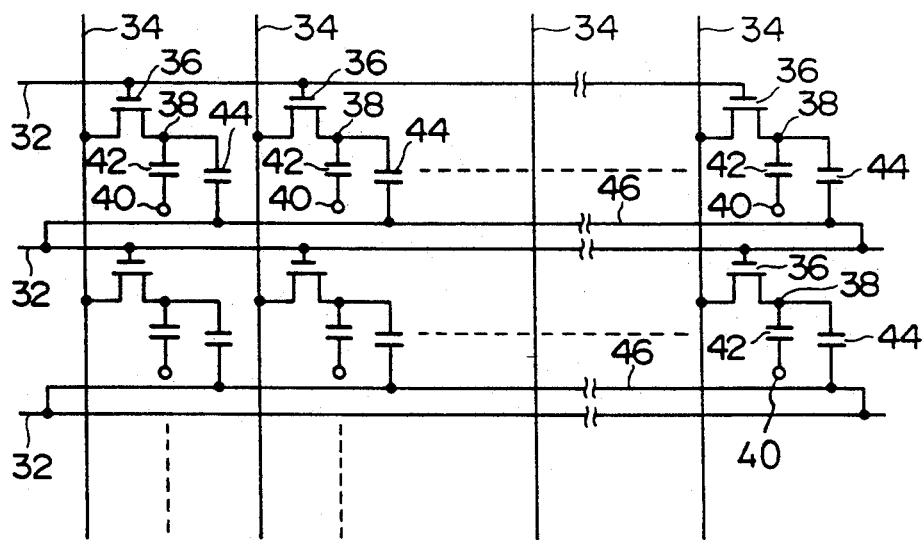
FIG. 6 is an equivalent circuit diagram of a liquid crystal display device with a TFT array constructed in accordance with one embodiment of the present invention.

As shown in FIG. 6, a TFT array according to a first embodiment of the present invention comprises, as the previously described conventional one, a plurality of gate conductors 32 and a plurality of source conductors 34 crossing over the gate conductors 32. At the respective cross overs, TFT's 36 are disposed forming a matrix of TFT's arranged in rows and columns. Gates of TFT's 36 in each row are connected to an associated gate conductor 32, and sources of TFT's 36 in each column are connected to an associated source conductor 34. Drains of the TFT's 36 are connected to the respective ones of a plurality of pixel electrodes 38 arranged in rows and columns to form a matrix corresponding to the matrix of TFT's 36. As in the conventional device, the respective pixel electrodes 38 are in contact with one surface of, for example, a liquid crystal layer (not shown). A common electrode 40 is in contact with the other surface of the liquid crystal layer. A reference numeral 42 denotes a capacitance exhibited by the liquid crystal layer between each pixel electrode 38 and the common electrode 40.

One end of each of storage capacitances 44 arranged in a matrix is connected to each pixel electrode 38. A storage capacitance conductor 46 is provided for each row of storage capacitances 44. The other ends of the storage capacitances 44 in each row are connected to the storage capacitance conductor 46 for that row. The opposite ends of each of the storage capacitance conductors are connected to the respective ends of the gate conductor 32 for a next adjacent row of TFT's.

Figure 8:
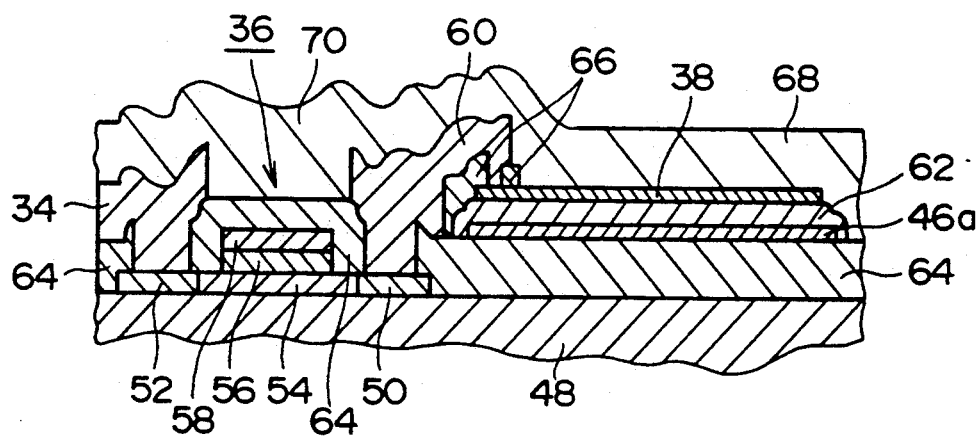
FIG. 8 is a cross-sectional view taken along the line 8—8 in FIG. 7.

TFT's 36, pixel electrodes 38, storage capacitances 44, and storage capacitance conductors 46 are constructed as shown in FIG. 8. Only one TFT 36 is shown in FIG. 8. A TFT 36 includes a drain region 50 and a source region 52 spaced from each other on a insulating transparent substrate 48, and an undoped silicon layer 54 disposed between the drain and source regions 50 and 52. A gate insulating film 56 is disposed on the undoped silicon layer 54. A gate electrode 58 is disposed on the gate insulating film 56. The gate electrode 58 is an extension of the gate conductor 32, which may be, for example, polycrystalline silicon doped with an impurity. The source region 52 is connected to the source conductor 34.

Figure 7:
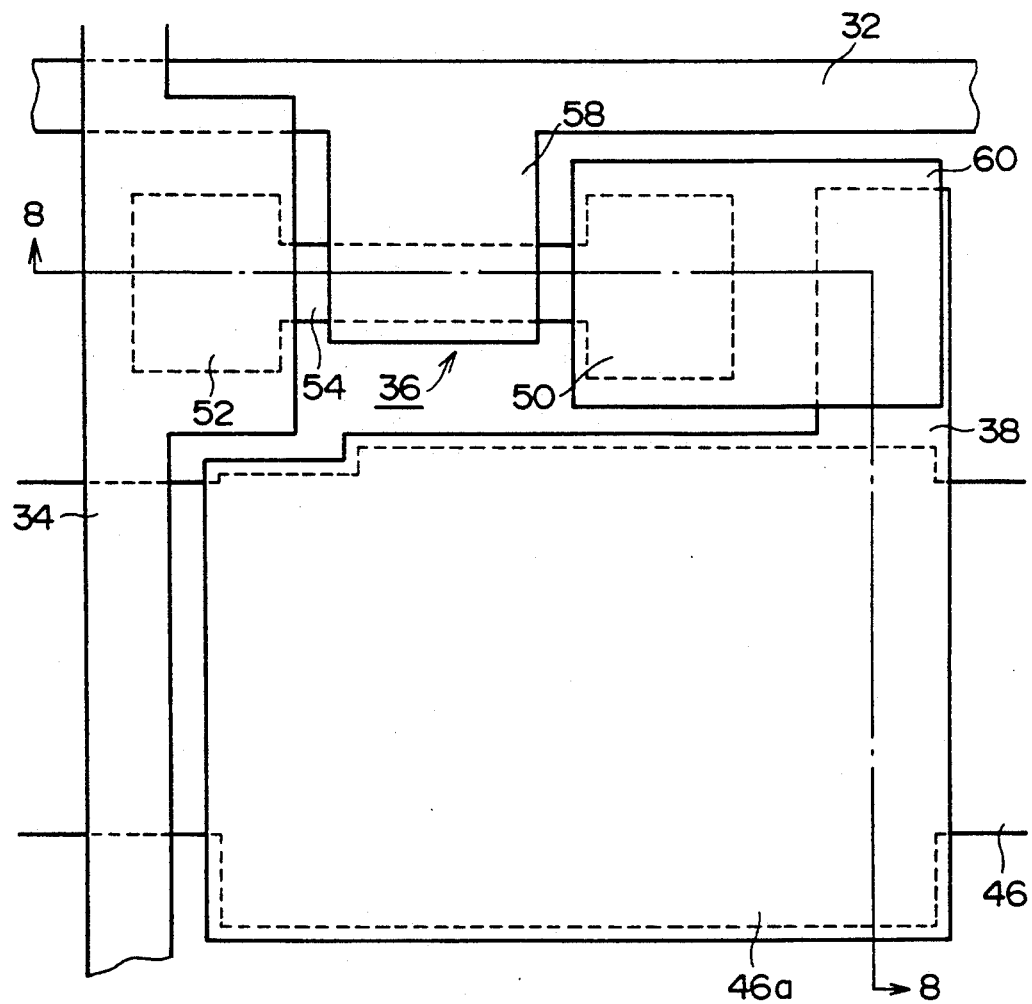
FIG. 7 is a plan view of a portion of the TFT array shown in FIG. 6.

The drain region 50 is connected to a drain electrode 60 which, in turn, is connected to the associated pixel electrode 38. The pixel electrode 38 is a substantially rectangular transparent member, as shown in FIG. 7, which is made of a conductive material, such as indium tin oxide. As is shown in FIG. 8, under the pixel electrode 38 is a transparent storage capacitance insulating film 62 in contact with the pixel electrode 38, and an expansion 46a of the storage capacitance conductor 46 extends beneath the insulating film 62. The pixel electrode 38, the insulating film 62, and the expansion 46a provide together the storage capacitance 44.

As stated above, the storage capacitance conductor 46 for each row has the expanded portions 46a beneath respective pixel electrodes 38 in that row. For the storage capacitance conductors 46, a conductive material which is highly transmissive to visible light, such as indium tin oxide and indium oxide, may be used. The width and thickness of the storage capacitance conductors are selected to provide a lower resistance per unit length than the gate conductors 32.

A first interlayer-insulating film 64 extends between the source electrode 34 and the transparent, insulating substrate 48, and between the storage capacitance conductor expansion 46a and the substrate 48. The first interlayer-insulating film 64 surrounds the gate electrode 58 and the gate insulating film 56 between the source conductor 34 and the drain electrode 60. A second interlayer-insulating film 66 is disposed in the vicinity of the drain electrode 60. A protecting film 70 overlies the entire surface of the structure including the TFT's 36 and the pixel electrodes 38. A liquid crystal layer, not shown, is disposed on the protecting film 70, and a common electrode is disposed in contact with the other surface of the liquid crystal layer. For simplicity, the interlayer-insulating films 64 and 66 and the protecting film 70 are not shown in FIG. 7.

Figure 9A:
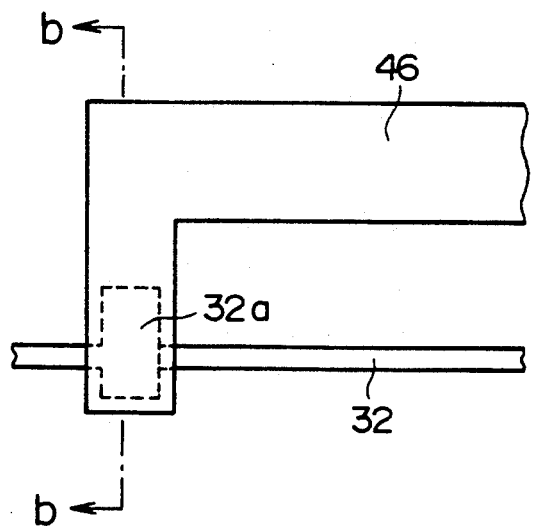
FIG. 9a is a plan view of a portion of the TFT array of FIG. 6 where an end of a storage capacitance conductor is connected to a gate conductor.
Figure 9B:
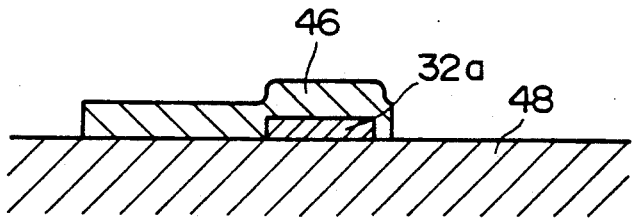

The opposite ends of each of the storage capacitance conductors 46 are connected to the respective opposite ends of the adjacent row gate conductor 32, as shown in FIGS. 9a and 9b, in which only one end is shown. The connection of the conductors 46 and 32 are provided by making them overlap each other. More specifically, expansions 32a in each of the gate conductors 32 provide a larger contact area between each conductor 32 and the corresponding storage capacitance conductor 46. Since the connection of the storage capacitance conductor 46 to the gate conductor 32 is provided at the ends of the conductor 32, the area of the expansion 32a at each end can be made larger than the sum of the areas of, for example, the TFT 36 and the pixel electrode 38, so that the contact resistance is reduced. A voltage for turning on the TFT's 36 is applied to each gate conductor only at one end.

A larger contact area provides reliable connection of the gate conductor 32 and the storage capacitance conductor 46. Furthermore, because the gate conductors 32 and the storage capacitance conductors 46 are connected at their opposite ends, even if one of the gate conductors is broken for some reason at a certain point, the voltage for turning on the TFT's 36 connected to that gate conductor 32 can be continuously applied from the end of that gate conductor 32 via the storage capacitance conductor 46 and the other end of that gate conductor 32 to the point where that gate conductor 32 is disconnected. Thus, even if any of the gate conductors 32 is disconnected, the respective TFT's connected to that gate conductor can still continuously receive the voltage for turning on them. Furthermore, because the resistance per unit length of the storage capacitance conductors 46 is smaller than that of the gate conductors 32, the storage capacitance conductor 46 can transmit the voltage applied at one end of the gate conductor 32 in an instant to the other end of that gate conductor so that substantially the same results as could be obtained by applying the turn-on voltage at the two opposite ends of the gate conductor 32 is achieved.

In Japanese Unexamined Patent Publication No. HEI 3-141325, auxiliary electrodes similar to the storage capacitance conductors 46 of the present invention are used. The auxiliary electrodes, however, are connected to the common electrode. Therefore the arrangement shown in this Japanese publication cannot deal with disconnection of the gate conductors, or it cannot provide the advantage that the TFT turn-on voltage could be applied to TFT's substantially simultaneously from opposite ends of the gate conductors.

FIGS. 10-13 illustrate a second embodiment of the present invention. According to this embodiment, each of storage capacitance conductors 461 (only one of them being shown), underlying a respective one of pixel electrodes 381 comprises a layer 462 of a material, such as chromium, aluminum and copper, which is low in transmissivity to visible light but high in electrical conductivity, and a layer 463, overlying the layer 462, of a material, such as indium tin oxide, which is relatively low in conductivity, but high in transmissivity to visible light. In order to provide a higher aperture ratio for pixels, it is preferable for the layer 462 to have a width of 10 $\mu$m or less. The width of the layer 463 should be as large as possible, for example, 50 $\mu$m or greater, although it is restricted by the width of the pixel electrode.

Figure 10:
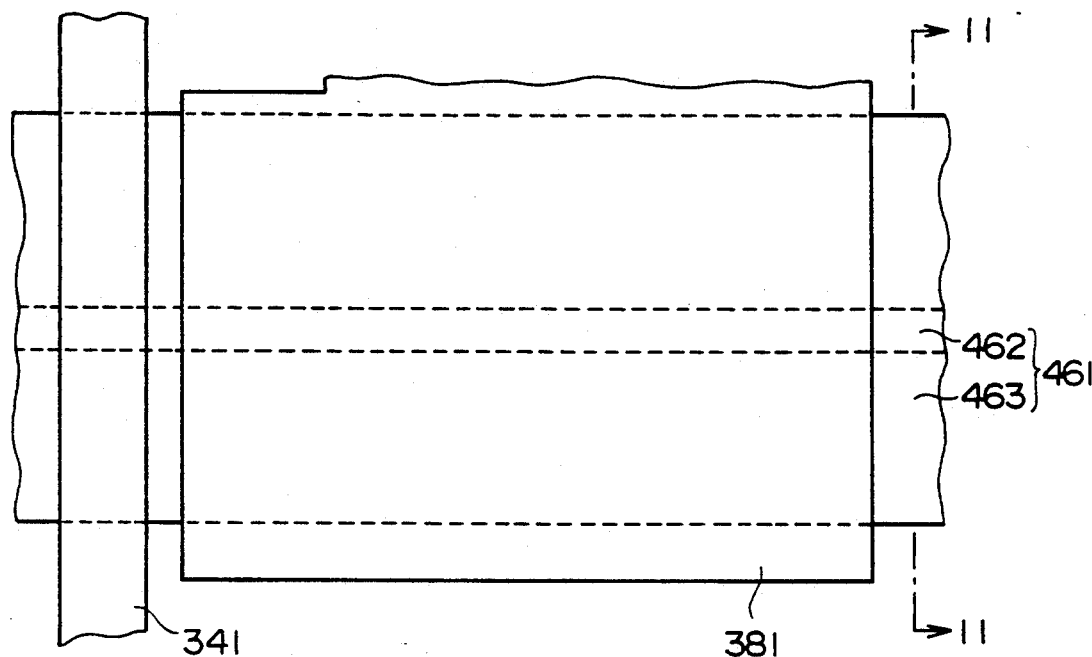
FIG. 10 is a plan view of a portion of a TFT array constructed in accordance with a second embodiment of the present invention.
Figure 11:
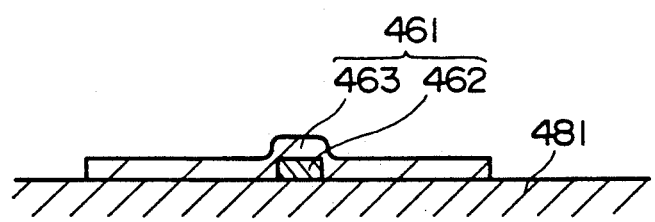
FIG. 11 is a cross-sectional view takes along the line 11—11 in FIG. 10.

In FIG. 10, a reference numeral 341 denotes a source conductor, and a reference numeral 481 in FIG. 11 denotes a transparent insulating substrate.

As shown in FIGS. 12 and 13, connection of the two opposite ends of the storage capacitance conductor 461 to the gate conductor 321 for the next adjacent row of TFT's is provided by an expanded portion 321a of a gate conductor 321 that contacts the layer 463 of the storage capacitance conductor 461.

The use of highly conductive layer 462 for the storage capacitance conductors advantageously reduces the resistance of the storage capacitance conductors 461. Furthermore, the use of small-width layers 462 and large-width, highly transparent layers 463 suppresses reduction of the aperture ratio.

In FIG. 14, a third embodiment of the present invention is illustrated. The structure is substantially the same as the one shown in FIGS. 6-9, except for the connection of the two opposite ends of a storage capacitance conductor 462 to a gate conductor 322. In this embodiment, the storage capacitor conductors 462 and the respective gate conductors 322 are connected by means of connector electrodes 72 of the same material as source conductors, such as aluminum, titanium and copper. A reference numeral 74 denotes an interlayer insulating film.

Figure 15:
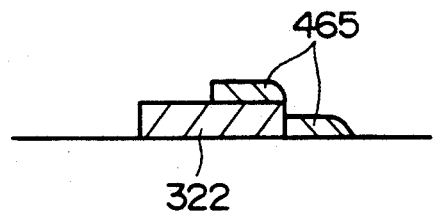
FIG. 15 is cross-sectional view showing a gate conductor and a storage capacitance conductor connected in accordance with a conventional technique.

When a gate conductor 322 overlaps a storage capacitance conductor 465 to interconnects them, as shown in FIG. 15, the storage capacitance conductor 465 could be disconnected at a step as shown if the thickness of the conductor 465 is smaller than that of the gate conductor 322.

Further, if the gate conductors are formed of chromium, and the storage capacitance conductors are formed of indium tin oxide, the chromium gate conductors will be oxidized so that when the indium tin oxide storage capacitance conductors are connected to the gate conductors, contact resistance will be undesirably increased.

In contrast, the use of sufficiently thick connector electrodes 72 as shown in FIG. 14 provides reliable connections. Furthermore, the use of the same material as the material of the source conductors which exhibits a low contact resistance with respect to an oxide conductor material, such as indium tin oxide, provides a low contact resistance even if the material of the gate conductors is a material which can be readily oxidized.

FIG. 16 shows a fourth embodiment. Different from the first embodiment in which both ends of the storage capacitance conductors 46 are connected to respective ends of the gate conductors 32, each of storage capacitance conductors 466 in the arrangement shown in FIG. 16 is connected only at one end to a gate conductor 323. The remainder of the structure is the same as the first embodiment, and similar components are indicated by the same reference numerals with a letter "b" added to the ends of the reference numerals.

In the embodiment shown in FIG. 16, the gate conductor 323 and the storage capacitance conductor 466 are connected by a connecting arrangement similar to the one provided between the gate conductor 32 and the storage capacitance conductor 46 shown in FIGS. 9a and 9b, and, therefore, reliable connection can be provided.

Of course, the TFT array according to the fourth embodiment can be modified in accordance with the second embodiment in which each of the storage capacitance conductors 466 comprises a high conductivity, low transmissivity layer and a low conductivity, high transmissivity layer, and/or in accordance with the third embodiment in which each of the storage capacitance conductors 466 is connected to a gate conductor 323 by means of a connector electrode of the same material as the source conductor.

What is claimed is:

1. A thin-film-transistor (TFT) array for a display comprising:
   an array of TFTs arranged in rows and columns, each TFT having a gate, a source, and a drain;
   a plurality of spaced apart gate conductors, each gate conductor having opposed first and second ends, one of said gate conductors being provided for each row of said TFTs and connected to said gates of said TFTs in that row;
   a plurality of spaced apart source conductors crossing over said gate conductors, one of said source conductors being provided for each column of said TFT's and connected to said sources of said TFTs in that column;
   a matrix of pixel electrodes arranged in rows and columns corresponding to the rows and columns of said TFTs, said pixel electrodes in each of the rows being connected to said drains of corresponding TFTs in that row;
   a matrix of display sections arranged in rows and columns corresponding to the rows and columns of said TFTs, each of said display sections including a storage capacitor having first and second terminals with the first terminal connected to said drain of a corresponding TFT; and
   a plurality of storage capacitance conductors spaced from said gate conductors, said second terminals of said storage capacitors of said display section in each row being connected to corresponding storage capacitance conductors, the storage capacitance conductor connected through said storage capacitors to drains of TFTs for each row respectively being connected to the gate conductor connected to said gates of said TFTs in an adjacent row at least one of said first and second ends of that gate conductor.

2. A TFT array according to claim 1 wherein said storage capacitance conductor connected through said storage capacitors to drains of TFT's for each row is connected to the gate conductor connected to said gates of said TFT's in an adjacent row at both the first and second ends of that gate conductor.

3. A TFT array according to claim 1 wherein said storage capacitance conductors and said gate conductors have respective resistances per unit length and the resistance per unit length of said storage capacitance conductors is smaller than the resistance per unit length of said gate conductors.

4. A TFT array according to claim 2 wherein said storage capacitance conductors and said gate conductors have respective resistances per unit length and the resistance per unit length of said storage capacitance conductors is smaller than the resistance per unit length of said gate conductors.

5. A TFT array according to claim 1 wherein each of said gate conductors has an expanded end portion and an associated storage capacitance conductor overlaps and is connected to said expanded portion of said gate conductor.

6. A TFT array according to claim 2 wherein each of said gate conductors has an expanded end portion and an associated storage capacitance conductor overlaps and is connected to said expanded portion of said gate conductor.

7. A TFT array according to claim 1 wherein said storage capacitance conductors are an electrically conductive material that is more transparent to visible light than any of chromium, aluminum, and copper.

8. A TFT array according to claim 2 wherein said storage capacitance conductors are an electrically conductive material that is more transparent to visible light than any of chromium, aluminum, and copper.

9. A TFT array according to claim 1 wherein each of said storage capacitance conductors comprises a layer of an electrically conductive material more transparent to visible light than any of chromium, aluminum, and copper and a layer of an electrically conductive material less transparent to visible light than indium tin oxide and indium oxide.

10. A TFT array according to claim 2 wherein each of said storage capacitance conductors comprises a layer of an electrically conductive material more transparent to visible light than any of chromium, aluminum, and copper and a layer of an electrically conductive material less transparent to visible light than indium tin oxide and indium oxide.

11. A TFT array according to claim 1 wherein said storage capacitance conductors and said gate conductors are interconnected by electrodes.

12. A TFT array according to claim 2 wherein said storage capacitance conductors and said gate conductors are interconnected by electrodes.

13. A TFT array according to claim 1 wherein said storage capacitance conductors are an electrically conductive oxide material and include connector electrodes connecting said storage capacitance conductors to the corresponding gate conductors.

14. A TFT array according to claim 2 wherein said storage capacitance conductors are an electrically conductive oxide material and include connector electrodes connecting said storage capacitance conductors to the corresponding gate conductors.

* * * * *